United States Patent
Besse et al.

(10) Patent No.: US 9,536,869 B2
(45) Date of Patent: Jan. 3, 2017

(54) ELECTROSTATIC DISCHARGE PROTECTION APPARATUS AND METHOD THEREFOR

(75) Inventors: Patrice Besse, Toulouse (FR); Eric Rolland, Grepiac (FR)

(73) Assignee: NXP USA, Inc., Austin, TX (US)

(*) Notice: Subject to any disclaimer, the term of this patent is extended or adjusted under 35 U.S.C. 154(b) by 2020 days.

(21) Appl. No.: 12/304,849

(22) PCT Filed: Jul. 3, 2006

(86) PCT No.: PCT/IB2006/053367
§ 371 (c)(1),
(2), (4) Date: Dec. 15, 2008

(87) PCT Pub. No.: WO2008/004035
PCT Pub. Date: Jan. 10, 2008

(65) Prior Publication Data
US 2009/0116157 A1    May 7, 2009

(51) Int. Cl.
*H01L 27/02*    (2006.01)

(52) U.S. Cl.
CPC ................. *H01L 27/0259* (2013.01)

(58) Field of Classification Search
USPC .......................................................... 361/56
See application file for complete search history.

(56) References Cited

U.S. PATENT DOCUMENTS

| | | | |
|---|---|---|---|
| 4,757,363 A * | 7/1988 | Bohm et al. | 257/358 |
| 4,989,057 A | 1/1991 | Lu | |
| 5,526,214 A * | 6/1996 | Takata et al. | 361/56 |
| 5,568,345 A | 10/1996 | Mudd et al. | |
| 5,751,525 A * | 5/1998 | Olney | 361/56 |
| 6,611,028 B2 * | 8/2003 | Cheng et al. | 257/361 |
| 7,075,763 B2 * | 7/2006 | Marr | 361/56 |
| 7,638,847 B1 * | 12/2009 | O et al. | 257/355 |
| 2002/0060890 A1 | 5/2002 | Steinhoff et al. | |
| 2004/0085093 A1 * | 5/2004 | Marr | 326/82 |

FOREIGN PATENT DOCUMENTS

| | | |
|---|---|---|
| EP | 0651490 A1 | 9/1994 |
| EP | 1482554 B1 | 5/2003 |
| JP | 0297066 A | 4/1990 |
| JP | 2001339044 A | 12/2001 |

OTHER PUBLICATIONS

International Search Report and Written Opinion correlating to PCT/IB2006/053367, dated Mar. 19, 2007.

(Continued)

*Primary Examiner* — Ann Hoang
(74) *Attorney, Agent, or Firm* — Charlene R. Jacobsen

(57) ABSTRACT

An electrostatic discharge protection apparatus comprises a stack arrangement having a first electrostatic discharge protection element and a second electrostatic discharge protection element. The stack arrangement is arranged to provide a bias potential between the first and second electrostatic discharge protection elements. In one embodiment, the bias potential can be achieved by a clamp arrangement coupled across the stack arrangement.

20 Claims, 2 Drawing Sheets

(56) References Cited

OTHER PUBLICATIONS

Chen J Z et al. "Design and layout of a high ESD performance NPN structure for submicron BiCMOS/bipolar circuits" Reliability Physics Symposium, 1996. 34th Annual Proceedings., IEEE International Dallas, TX, USA Apr. 30-May 2, 1996, New York, NY, USA, IEEE, US, Apr. 30, 1996, p. 227-232, XP010157571, ISGN: 0-7803-2753-5.

Joshi S et al. "An analysis of bipolar breakdown and its application to the design of ESD protection circuits" 2001 IEEE International Reliability Physics Symposium Proceedings. 39th Annual. Orlando, FL, Apr. 30-May 3, 2001, IEEE International Reliability Physics Symposium, New Yor,, NY, IEEE, US, Apr. 30, 2001, p. 240-245, XP010542540, ISGN: 0-7803-6587-9.

* cited by examiner

ELECTROSTATIC DISCHARGE PROTECTION APPARATUS AND METHOD THEREFOR

FIELD OF THE INVENTION

This invention relates to an electrostatic discharge apparatus of the type, for example, comprising a stack arrangement having a first electrostatic discharge protection element serially coupled to a second electrostatic discharge protection element for responding to an electrostatic discharge event. This invention also relates to the method of providing protection from an electrostatic discharge event of the type that, for example, uses a stack having a first electrostatic discharge protection element serially coupled to a second electrostatic discharge protection element.

BACKGROUND OF THE INVENTION

In the field of electrostatic discharge protection, it is known to provide, for example for automotive applications, a stack of low-voltage protection devices including a first NPN bipolar transistor serially coupled to a second NPN bipolar transistor. Each of the first and second NPN bipolar transistors is self-biased, the first and second NPN transistors having respective trigger voltages of, for example, 45V. The first and second NPN transistors are selected and configured so as to provide a trigger voltage, $V_{t1}$, above which an ESD event causes the first and second transistors to conduct resulting in the ESD event being short-circuited through the first and second NPN transistors to, for example, ground potential.

However, an interconnecting node between the first and second NPN bipolar transistors "floats", i.e. does not remain at a constant potential, and so when an Electromagnetic Interference or a fast transient event occurs, parasitic elements, for example parasitic capacitances of the first and second NPN transistors, cause an imbalance in the voltage applied across the first NPN transistor and the second NPN transistor.

Consequently, the potential across the first NPN transistor can, for example, reach 45V, whereas the potential across the second NPN transistor only reaches 15V. In such a situation, the serially coupled first and second NPN transistors behave unexpectedly. In this respect, once the first NPN transistor has switched on, the potential across the first transistor falls to a snapback voltage of the first NPN transistor, for example 13V, resulting in the potential across the second NPN transistor subsequently rising to the trigger voltage, for example the 45V level mentioned above, due to the resistive properties of the second NPN transistor when not triggered. Hence, undesirably, the second NPN transistor is triggered into an activated state. Consequently, both the first and second NPN transistors are latched into "on" states even though the combined trigger voltage, $V_{t1}$, has not been reached, resulting in sustained current flow through both the first and second NPN transistors subsequent to the occurrence of the Electromagnetic Interference or the fast transient event. The sustained current flow through the stack either destroys the stack or prevents a circuit that is protected by the stack from functioning correctly.

STATEMENT OF INVENTION

According to the present invention, there is provided an electrostatic discharge protection apparatus and a method of providing protection from an electrostatic discharge event as set forth in the appended claims.

BRIEF DESCRIPTION OF THE DRAWINGS

At least one embodiment of the invention will now be described, by way of example only, with reference to the accompanying drawings, in which.

DESCRIPTION OF PREFERRED EMBODIMENTS

Figure 1:
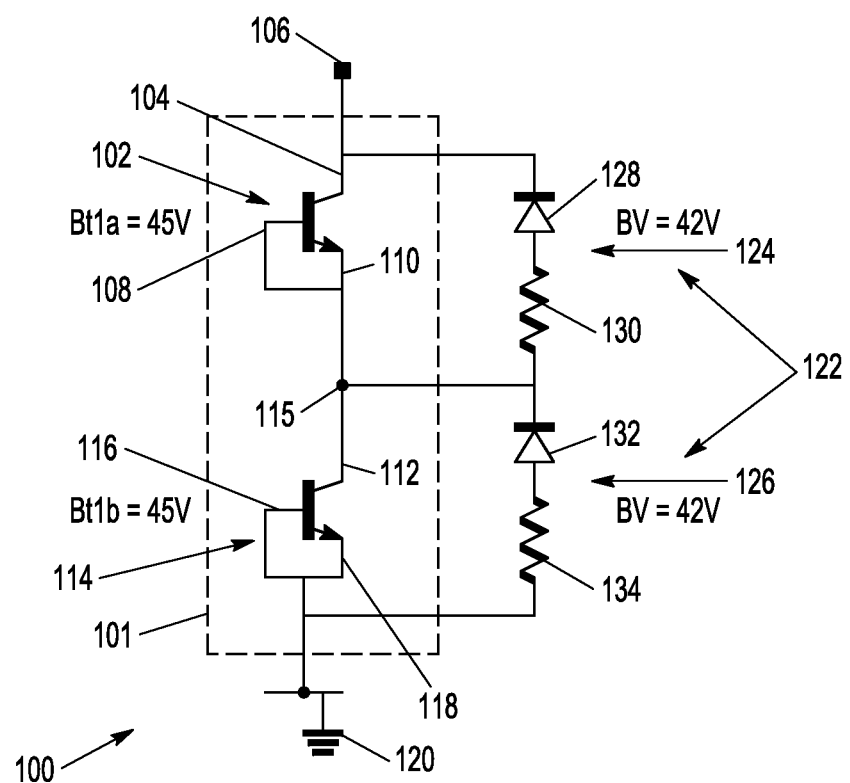
FIG. 1 is a schematic circuit diagram of an electrostatic discharge protection apparatus constituting an embodiment of the invention.

Throughout the following description identical reference numerals will be used to identify like parts.

Referring to FIG. 1, an Electrostatic Discharge (ESD) protection apparatus 100 comprises a stack 101 having a first NPN bipolar transistor 102 having a first collector terminal 104 thereof coupled to a pad 106 of an integrated circuit (not shown) in order to protect circuitry or a device (also not shown) coupled to the pad 106. The first NPN transistor 102 is self-biased and so has a first base terminal 108 coupled to a first emitter terminal 110 thereof.

The first base and first emitter terminals 108, 110 of the first NPN transistor 102 are coupled to a second collector terminal 112 of a second NPN bipolar transistor 114. As a result of the coupling of the first NPN transistor 102 to the second NPN transistor 114, a notional topological node 115 exists between the first and second NPN transistors 102, 114.

The second NPN transistor 114 is also self-biased and so has a second base terminal 116 coupled to a second emitter terminal 118 thereof. The second base and second emitter terminals 116, 118 of the second NPN transistor 114 are coupled, in this example, to a ground potential 120.

Additionally, a clamp arrangement 122 is coupled to the stack 101 in order to maintain a bias potential between the first and second NPN transistors 102, 114. In this example, the clamp arrangement 122 comprises a first voltage clamp 124 serially coupled to a second voltage clamp 126.

The first voltage clamp 124 comprises a first diode 128 having a cathode terminal coupled to the first collector terminal 104 of the first NPN transistor 102 and an anode terminal coupled, via a first resistor 130 to the first emitter terminal 110 of the first NPN transistor 102 and the second collector terminal 112 of the second NPN transistor 114. The second voltage clamp 126 comprises a second diode 132 having a cathode terminal coupled to the first resistor 130 and an anode terminal coupled to the second emitter terminal 118 of the second NPN transistor 114 via a second resistor 134. The skilled person will, of course, appreciate that the first and/or second resistors 130, 134 can be metallic, polysilicon, or formed by doping diffusion of a semiconductor material. Alternatively, internal resistances of the first and/or second diodes 128, 132 can serve as the first and/or second resistors 130, 134, respectively.

Although the above example has been described in the context of the first and second NPN bipolar transistors 102, 114, the skilled person will appreciate that other devices can be employed. In this respect, a first electrostatic discharge protection element can be any suitable variable voltage device, for example a first threshold-dependent conduction device and a second threshold-dependent conduction device, such as a first switching device and a second switching device. Examples of suitable devices include: Field Effect Transistors (FETs), such as Metal Oxide FETs (MOSFETs), thyristors, or Silicon Control Rectifiers (SCRs).

In operation, the apparatus 100 serves to redirect an ESD event from the integrated circuit by creating a short-circuit to the ground potential 120 when a first potential exceeding a threshold voltage, $VT_1$, is applied across the stack 101 as a result of occurrence of the ESD event. In this respect, the threshold voltage, $VT_1$, is set to a value exceeding a maximum operating voltage, $V_m$ of the integrated circuit. In this example, the maximum operating voltage, $V_m$, is 60V DC and the threshold voltage, $VT_1$ is 90V DC. The threshold voltage, $VT_1$, is achieved by the first NPN transistor 102 having a first trigger voltage, $VT_{1a}$, of 45V and the second NPN transistor 114 having a second trigger voltage, $VT_{1b}$, of 45V. When the ESD event exceeds the threshold voltage, $VT_1$, of 90V, the first and second NPN transistors 102, 114 are activated and form the short-circuit to the ground potential 120.

The clamp arrangement 122 is provided to inhibit creation of the short-circuit by the first and second NPN transistors 102, 114 to the ground potential 120 when a parasitic event occurs.

A parasitic event, for example an ElectroMagnetic Interference (EMI) event or a fast transient event, is an application of a first transient voltage signal across the stack 101 and having a rise time of less than, for example, about 1 ms, such as less than about 10 ps or between about 10 ps and 100 ns. The first voltage clamp 124 therefore maintains, in this example, a first clamp potential of 42V across the first NPN transistor 102 and the second voltage clamp 126 therefore maintains, in this example, a second clamp potential of 42V across the second NPN transistor 114.

It can therefore be seen that a (bias) potential between the first and second NPN transistors 102, 114 at the node 115 is fixed. Further, in this example, a minimum threshold potential, or further bias potential, of 84V (42V+42V) can be maintained across the stack 101 as a result of the breakdown voltages of the first and second diodes 128, 132 being lower than the first and second trigger voltages, $VT_{1a}$, $VT_{1b}$, respectively.

Consequently, when the parasitic event occurs, the first and second clamp potentials across the first and second NPN transistors 102, 114 are rapidly reached by virtue of the presence of the first and second voltage clamps 124, 126, respectively. In this respect, once the first clamp potential across the first NPN transistor 102 is reached, the potential across the second NPN transistor 114 rapidly rises to the second clamp potential. Further, the minimum threshold potential of 84V is maintained. Hence, the first and second NPN transistors 102, 114 cannot be activated to create the short-circuit from the pad 106 to ground potential 120, unless the potential applied across the stack 101 exceeds both the minimum threshold potential and the threshold voltage, $VT_1$.

Figure 2:
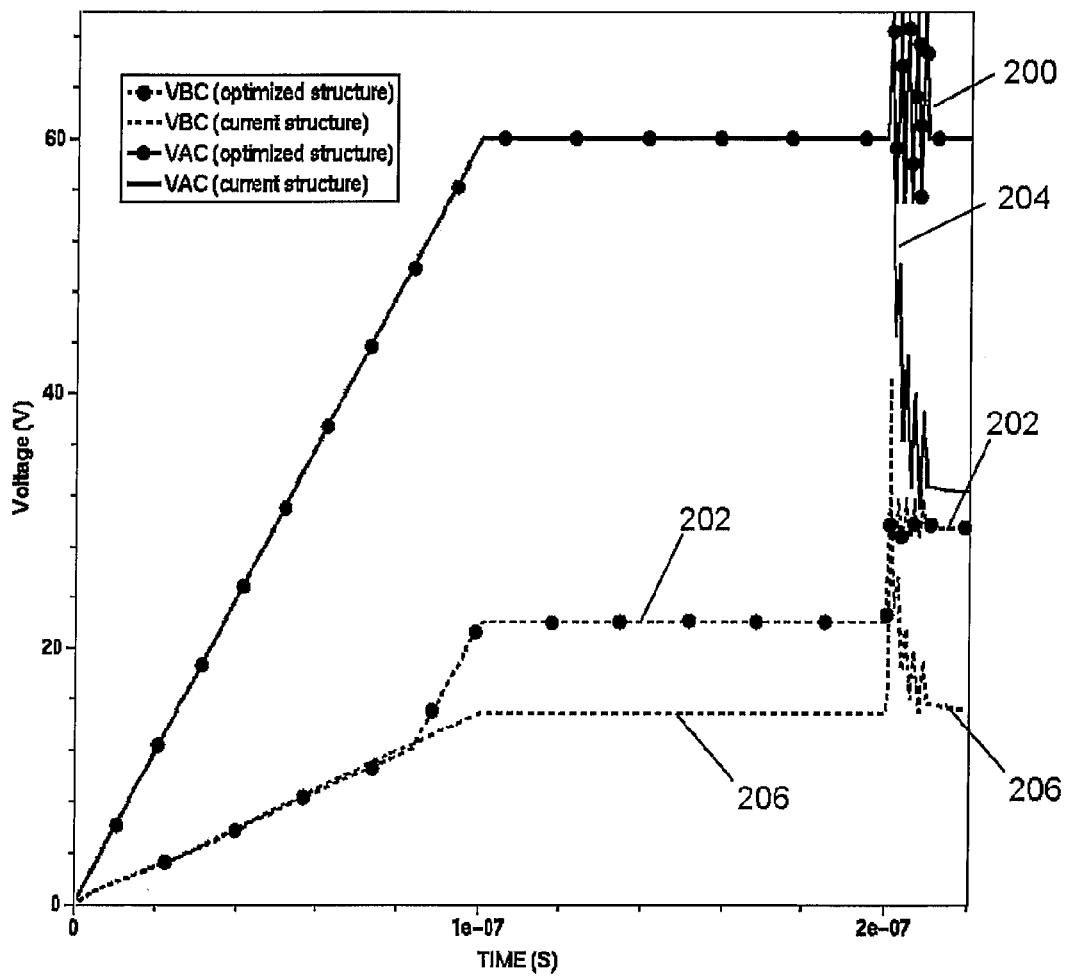
FIG. 2 is a graph of a response of the apparatus of FIG. 1 with respect to a known electrostatic discharge protection apparatus.

Referring to FIG. 2, after 0.1 µs the stack 101 reaches an operational state. The parasitic event 200 occurs at about 0.2 µs, but is insufficient in magnitude to exceed the minimum threshold potential of 84V. The potential applied across the stack 101 therefore remains stable and does not result in the potential across the first NPN transistor 102 dropping to a snapback voltage of the first NPN transistor 102. Consequently, a potential 202 across the second NPN transistor 114 rises to about 28V but does not increase to the second trigger voltage, $VT_{1b}$, associated with the second NPN transistor 114 and hence the short-circuit is not created.

In contrast, without the clamp arrangement 122, the potential 204 across the first NPN transistor 102 reaches the first trigger voltage, $VT_{1a}$, and then falls to the snapback voltage of about 13V. Once the snapback voltage has been attained, the potential 206 across the second NPN transistor 114 rises to the second trigger voltage, $VT_{1b}$, and so the second NPN transistor 114 activates resulting in the creation of the short-circuit to the ground potential 120 and hence current can flow subsequently through both the first and second NPN transistors 102, 114, typically resulting in destruction of the stack 101.

Although not mentioned above, the skilled person will readily appreciate that where the impedance across the second NPN transistor 114 is lower than the impedance across the first NPN transistor 102, the above-described triggering of the first and second NPN transistors 102, 114 will occur in reverse. In this respect, the second trigger voltage, $VT_{1b}$, will be reached across the second NPN transistor 114 before the first trigger voltage, $VT_{1a}$, is reached across the first NPN transistor 102.

The above example has been described in relation to positive voltage signals. However, the above-described structure can be modified in a manner readily apparent to the skilled person in order to provide an implementation in relation to negative voltage signals.

It is thus possible to provide a method and apparatus capable of not being triggered by the occurrence of a parasitic event, i.e. is insensitive to the parasitic event. Additionally, the apparatus does not suffer from so-called latch-up, whilst providing a minimum triggering voltage for the stack. Hence, ESD protection can be achieved with improved reliability and robustness with respect to parasitic events, and in particular EMI. Of course, the above advantages are exemplary, and these or other advantages may be achieved by the invention. Further, the skilled person will appreciate that not all advantages stated above are necessarily achieved by embodiments described herein.

The invention claimed is:
1. An electrostatic discharge protection apparatus, comprising:
   a stack arrangement having:
   a first electrostatic discharge protection element comprising a first terminal, and a second terminal; and
   a second electrostatic discharge element comprising a first terminal, and a second terminal, the first electrostatic discharge protection element serially coupled to the second electrostatic discharge protection element, wherein the first electrostatic discharge protection element includes a transistor having a collector terminal, an emitter terminal, and a base terminal connected to the emitter terminal; the stack arrangement to provide a bias potential between the first and second electrostatic discharge protection elements based on a breakdown voltage of the first and second electrostatic discharge protection elements;
   the stack arrangement further comprises a clamp arrangement including a first voltage clamp serially coupled to a second voltage clamp, the clamp arrangement to provide a further bias potential across the first and second electrostatic discharge protection elements responsive to a breakdown voltage of each of the first and second voltage clamps, wherein a potential at the node between the first and second electrostatic discharge protection elements is substantially equal to a potential at a node between the first and second voltage clamps; and the second electrostatic discharge protection element is further inhibited from responding to a parasitic event at potentials below the further bias potential in response to the breakdown voltage of the first and second electrostatic discharge protection elements being higher than the breakdown voltage of the first and second voltage clamps.

2. An apparatus as claimed in claim 1, wherein the bias potential is substantially fixed.

3. An apparatus as claimed in claim 2, wherein the first and second electrostatic discharge protection elements are arranged to provide a threshold voltage for re-directing an electrostatic discharge event.

4. An apparatus as claimed in claim 1, wherein the first and second electrostatic discharge protection elements are arranged to provide a threshold voltage for re-directing an electrostatic discharge event.

5. An apparatus as claimed in claim 4, wherein the first voltage clamp is serially coupled to the second voltage clamp, wherein the further bias potential is less than the threshold voltage.

6. An apparatus as claimed in claim 4, wherein the first electrostatic discharge protection element is a first switching device and/or the second electrostatic discharge protection element is a second switching device.

7. An apparatus as claimed in claim 1, wherein the first voltage clamp is coupled in parallel with the first electrostatic discharge protection element and the second voltage clamp is coupled in parallel with the second electrostatic discharge protection element.

8. An apparatus as claimed in claim 7, wherein the first and second electrostatic discharge protection elements are arranged to provide a threshold voltage for re-directing an electrostatic discharge event.

9. An apparatus as claimed in claim 7, wherein the first electrostatic discharge protection element is a first voltage variable element, and/or the second electrostatic discharge protection element is a second voltage variable element.

10. An apparatus as claimed in claim 1, wherein the first electrostatic discharge protection element is a first voltage variable element, and/or the second electrostatic discharge protection element is a second voltage variable element.

11. An apparatus as claimed in claim 1, wherein the first electrostatic discharge protection element is a first threshold-dependent conduction device and/or the second electrostatic discharge protection element is a second threshold-dependent conduction device.

12. An apparatus as claimed in claim 1, wherein the first electrostatic discharge protection element is a first switching device and/or the second electrostatic discharge protection element is a second switching device.

13. An apparatus as claimed in claim 1, wherein the first voltage clamp comprises a first diode and/or the second voltage clamp comprises a second diode.

14. An apparatus as claimed in claim 13, wherein the first voltage clamp also comprises a first resistance in series with the first diode and/or the second voltage clamp also comprises a second resistance in series with the second diode.

15. An integrated circuit comprising the electrostatic discharge protection apparatus as claimed in claim 1.

16. A method of providing protection from an electrostatic discharge event using a stack arrangement having a first electrostatic discharge protection element serially coupled to a second electrostatic discharge element the method comprises:
biasing the stack arrangement so as to provide a bias potential between the first and second electrostatic discharge protection elements responsive to a breakdown voltage of the first and second electrostatic discharge protection elements;
providing a further bias potential across the first and second electrostatic discharge protection elements responsive to a breakdown voltage of each of a first voltage clamp and a second voltage clamp of a clamp arrangement, wherein a potential at a node between the first and second electrostatic discharge protection elements is substantially equal to a potential at a node between the first and second voltage clamps;
providing a threshold voltage across the first electrostatic discharge protection element based on the first electrostatic discharge protection element including a transistor having a collector terminal, an emitter terminal, and a base terminal connected to the emitter terminal; and
inhibiting the second electrostatic discharge protection element from responding to a parasitic event at potentials below the further bias potential in response to the breakdown voltage of the first and second electrostatic discharge protection elements being higher than the breakdown voltage of the clamp arrangement.

17. An apparatus comprising:
a first transistor including a collector terminal coupled to a pad, an emitter terminal, and a base terminal connected to the emitter terminal;
a second transistor including a collector terminal coupled to the emitter terminal of the first transistor, an emitter terminal coupled to a ground potential, and a base terminal connected to the emitter terminal of the second transistor, wherein a breakdown voltage of the first transistor is substantially the same as a breakdown voltage of the second transistor, and wherein the stack arrangement has a bias potential responsive to the breakdown voltage of the first transistor and the breakdown voltage of the second transistor;
a first voltage clamp including:
a first diode having a cathode terminal coupled to the collector terminal of the first transistor, and an anode terminal; and
a first resistor having a first terminal coupled to the anode terminal of the first diode, and a second terminal coupled to the emitter terminal of the first transistor;
wherein the first diode has a breakdown voltage; and
a second voltage clamp including:
a second diode having a cathode terminal coupled to the collector terminal of the second transistor, and an anode terminal; and
a second resistor having a first terminal coupled to the anode terminal of the second diode, and a second terminal coupled to the emitter terminal of the second transistor;
wherein the second diode has a breakdown voltage, wherein the breakdown voltage of the first diode is substantially the same as the breakdown voltage of the second diode, and wherein a potential between the first and second transistors is substantially equal to a potential between the first and second voltage clamps;
wherein a further bias potential is across the first transistor and the second transistor responsive to the breakdown voltage of the first and second diodes, and wherein the second transistor is inhibited from responding to a parasitic event at potentials below the further bias potential in response to the breakdown voltage of the first and second transistors being higher than the breakdown voltage of the first and second diodes.

18. The apparatus of claim 17, wherein the first and second transistors are arranged to provide a threshold voltage for re-directing an electrostatic discharge event.

19. The apparatus as claimed in claim 17, wherein the bias potential is substantially fixed.

20. An integrated circuit comprising the apparatus as claimed in claim 17.

* * * * *